(12) United States Patent
Roizin et al.

(10) Patent No.: US 7,016,225 B2
(45) Date of Patent: Mar. 21, 2006

(54) FOUR-BIT NON-VOLATILE MEMORY TRANSISTOR AND ARRAY

(75) Inventors: Yakov Roizin, Afula (IL); Micha Gutman, Haifa (IL); Shimon Greenberg, Hod Hasharon (IL); Alfred Yankelevich, Haifa (IL)

(73) Assignee: Tower Semiconductor Ltd., Migdal Haemek (IL)

( * ) Notice: Subject to any disclaimer, the term of this patent is extended or adjusted under 35 U.S.C. 154(b) by 542 days.

(21) Appl. No.: 10/305,403

(22) Filed: Nov. 26, 2002

(65) Prior Publication Data

US 2004/0100822 A1 May 27, 2004

(51) Int. Cl.
*G11C 16/04* (2006.01)

(52) U.S. Cl. .............................. 365/185.03; 365/185.01; 365/185.18; 365/185.24; 365/185.26; 365/185.27

(58) Field of Classification Search ............ 365/185.03, 365/185.01, 185.18, 185.24, 185.26, 185.27
See application file for complete search history.

(56) References Cited

U.S. PATENT DOCUMENTS 6,044,022 A * 3/2000 Nachumovsky ........ 365/185.28
6,456,531 B1 * 9/2002 Wang et al. ................. 348/143
6,552,387 B1 * 4/2003 Eitan ........................... 257/324

* cited by examiner

*Primary Examiner*—Richard Elms
*Assistant Examiner*—Pho M. Luu
(74) *Attorney, Agent, or Firm*—Bever, Hoffman & Harms, LLP; E. Eric Hoffman (57) ABSTRACT

A non-volatile memory cell capable of storing more than two bits of information. The NVM cell includes a semiconductor region having a first conductivity type, and a plurality of field isolation regions located in the semiconductor region. Four or more source/drain regions are located in the semiconductor region adjacent to the field isolation regions, the source/drain regions having a second conductivity type, opposite the first conductivity type. The field isolation regions and the source drain regions laterally surround a channel region in the semiconductor region. A gate structure, including a floating gate structure and a control gate structure, extends over the channel region, portions of the field isolation regions and portions of the source/drain regions. The floating gate structure includes a plurality of charge trapping regions, wherein each of the charge trapping regions is located adjacent to a corresponding one of the source/drain regions.

30 Claims, 10 Drawing Sheets

FOUR-BIT NON-VOLATILE MEMORY TRANSISTOR AND ARRAY

FIELD OF THE INVENTION

The present invention relates to multi-bit non-volatile memory transistors. More specifically, the present invention relates to a non-volatile memory transistor capable of storing four or more bits of information.

RELATED ART

Figure 1:
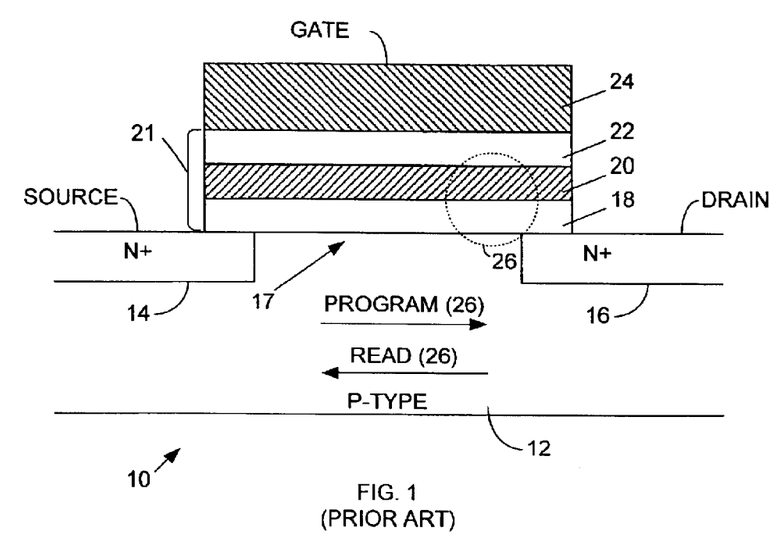
FIGS. 1 and 2 are cross sectional diagrams illustrating a conventional 2-bit non-volatile memory cell.

FIG. 1 is a cross sectional view of a conventional 2-bit non-volatile semiconductor memory cell 10 that utilizes asymmetrical charge trapping. 2-bit memory cell 10, which is fabricated in p-type substrate 12, includes n+ source region 14, n+ drain region 16, channel region 17, silicon oxide layer 18, silicon nitride layer 20, silicon oxide layer 22, and control gate 24. Oxide layer 18, nitride layer 20 and oxide layer 22 are collectively referred to as ONO layer 21. Memory cell 10 operates as follows. A first programming operation is performed by connecting source region 14 to ground, connecting drain region 16 to a programming voltage of about 5 Volts, and connecting control gate 24 to a voltage of about 10 Volts. As a result, electrons are accelerated from source region 14 to drain region 16. Near drain region 16, some electrons gain sufficient energy to pass through oxide layer 18 and be trapped in nitride layer 20 in accordance with a phenomenon known as hot electron injection. Because nitride layer 20 is non-conductive, the injected charge remains localized within charge trapping region 26 in nitride layer 20.

The bit stored in charge trapping region 26 of memory cell 10 is read by applying 0 Volts to the drain region 16, 2 Volts to the source region 14, and 3 volts to the gate electrode. If charge is stored in charge trapping region 26 (i.e., memory cell 10 is programmed), then memory cell does not conduct current under these conditions. If there is no charge stored in charge trapping region 26 (i.e., memory cell 10 is erased), then memory cell 10 conducts current under these conditions. The current, or lack of current, is sensed by a sense amplifier to determine the state of memory cell 10.

Note that the polarity of the voltage applied across source region 14 and drain region 16 is reversed during the program and read operations. That is, memory cell 10 is programmed in one direction (with source region 14 grounded), and read the opposite direction (with drain region 16 grounded). As a result, the read operation is referred to as a reverse read operation. Memory cell 10 is described in more detail in U.S. Pat. No. 5,768,192, to Eitan.

Figure 2:
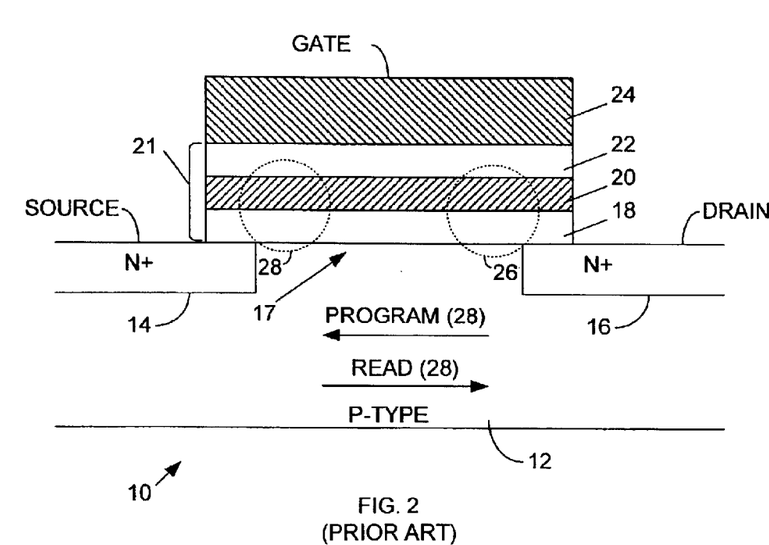

Memory cell 10 is also controlled to use a second charge trapping region in nitride layer 20, which is located adjacent to source region 14. FIG. 2 illustrates both the first charge trapping region 26 (described above in connection with FIG. 1), and the second charge trapping region 28 in dashed lines. The second charge-trapping region 28 is used to store a charge representative of a second bit. The second charge trapping region 28 is programmed and read in a manner similar to the first charge trapping region 26. More specifically, the second charge trapping region 28 is programmed and read by exchanging the source and drain voltages described above for programming and reading the first charge trapping region 26. Thus, the second charge trapping region 28 is programmed by applying 0 Volts to drain region 16, applying 5 Volts to source region 14 and applying 10 Volts to control gate 24. Similarly, the second charge trapping region 28 is read by applying 0 Volts to source region 14, 2 Volts to drain region 16, and 3 Volts to control gate 24.

Note that because nitride layer 20 is non-conductive, the charges stored in the first and second charge trapping regions 26 and 28 remain localized within nitride layer 20. Also note that the state of the first charge trapping region 26 does not interfere with the reading of the charge stored in the second charge trapping region 28 (and vice versa). Thus, if the first charge trapping region 26 is programmed (i.e., stores charge) and the second charge trapping region 28 is not programmed (i.e., does not store charge), then a reverse read of the first charge trapping region will not result in significant current flow. However, a reverse read of the second bit will result in significant current flow because the high voltage applied to drain region 16 will result in unperturbed electronic transfer in the pinch off region adjacent to first charge trapping region 26. Thus, the information stored in the first and second charge trapping regions 26 and 28 is read properly.

Similarly, if both the first and second charge trapping regions are programmed, a read operation in either direction will result in no significant current flow. Finally, if neither the first charge trapping region 26 nor the second charge trapping region 28 is programmed, then read operations in both directions will result in significant current flow.

Although the memory cell 10 is capable of storing 2-bits of data, it would be desirable to have a memory cell capable of storing more than 2-bits of data. It would further be desirable if such a memory cell could be laid out in an area-efficient manner, such that the memory density (bits per area) can be increased with respect to a 2-bit non-volatile memory cell. It would further be desirable if such a non-volatile memory cell could be fabricated using a conventional process.

SUMMARY

Accordingly, the present invention provides a 4-bit non-volatile memory cell and methods for operating this cell. The present invention also provides a method for fabricating this 4-bit NVM cell, which is largely compatible with a conventional CMOS process flow.

In accordance with one embodiment, a non-volatile memory cell capable of storing 4-bits of information is provided. The NVM cell includes a semiconductor region (such as a well region), and a plurality of field isolation regions located in the semiconductor region. The field isolation regions can have octagonal or rectangular shapes in various embodiments. Four source/drain regions are located in the semiconductor region adjacent to the field isolation regions, such that the four source/drain regions are located in an orthogonal configuration between the field isolation regions. The field isolation regions and the source drain regions laterally surround a channel region in the semiconductor region. A gate structure, including a floating gate structure and a control gate structure, extends over the channel region, as well as portions of the field isolation regions and portions of the source/drain regions. The floating gate structure includes four separate charge trapping regions, wherein each of the charge trapping regions is located adjacent to a corresponding one of the source/drain regions. In one embodiment, the floating gate structure is an oxide-nitride-oxide (ONO) structure. The 4-bit NVM cell can further include a plurality of metal bit lines coupled to the source/drain regions, wherein each of the source/drain regions is coupled to a separate bit line.

In accordance with another embodiment, an array of 4-bit NVM cells is provided. This array includes a plurality of field isolation regions located in a semiconductor substrate; a plurality of gate structures located over the semiconductor substrate, wherein each of the gate structures includes four charge trapping regions; and a plurality of cross-shaped source/drain regions defined by the field isolation regions and the gate structures. At central locations of the array, each of the cross-shaped source/drain regions serves as a source/drain for four different 4-bit non-volatile memory cells, thereby resulting in a compact layout configuration. Each of the gate structures preferably has a square shape. Word lines contact the gate structures to provide access to the NVM cells in the array. In one embodiment, these word lines are conductive polysilicon structures continuous with the gate structures and extending over the field isolation regions.

In accordance with another embodiment, a plurality of bit lines contact the source/drain regions, wherein each of the four source/drain regions associated with a single 4-bit non-volatile memory cell is coupled to a different bit line. In one embodiment, the bit lines are connected to the 4-bit non-volatile memory cells in an interleaved pattern.

The present invention also provides a method of fabricating an array of multi-bit non-volatile memory cells, the method comprising; forming a plurality of field isolation regions in a semiconductor substrate; forming a lower dielectric layer over the semiconductor substrate; forming a floating gate dielectric layer over the lower dielectric layer; forming an upper dielectric layer over the floating gate dielectric layer; forming a control gate layer over the upper dielectric layer; patterning the control gate layer, the upper dielectric layer and the floating gate dielectric layer to form a plurality of gate structures, each of the gate structures having a control gate structure formed from the control gate layer and a floating gate structure formed from the lower dielectric layer, the floating gate dielectric layer and the upper dielectric layer; and forming a plurality source/drain regions in the substrate, wherein four or more source/drain regions are aligned with each of the gate structures and the field isolation regions. Advantageously, the array of memory cells can be fabricated largely in accordance with conventional CMOS processing techniques.

The present invention also includes methods of operating a non-volatile memory cell. One such method includes the steps of: storing a first bit of information in a first charge trapping region of a floating gate structure; storing a second bit of information in a second charge trapping region of the floating gate structure; storing a third bit of information in a third charge trapping region of the floating gate structure; and storing a fourth bit of information in a fourth charge trapping region of the floating gate structure.

This method can further include the steps of: reading the first bit of information from the first charge trapping region of the floating gate structure; reading the second bit of information from the second charge trapping region of the floating gate structure; reading the third bit of information from the third charge trapping region of the floating gate structure; and reading the fourth bit of information from the fourth charge trapping region of the floating gate structure.

In accordance with the present invention, each of the four charge trapping regions is programmed with a current flow in a first direction, and is read with a current flow in a second direction, opposite the first direction.

The present invention will be more fully understood in view of the following description and drawings.

DETAILED DESCRIPTION

Figure 3:
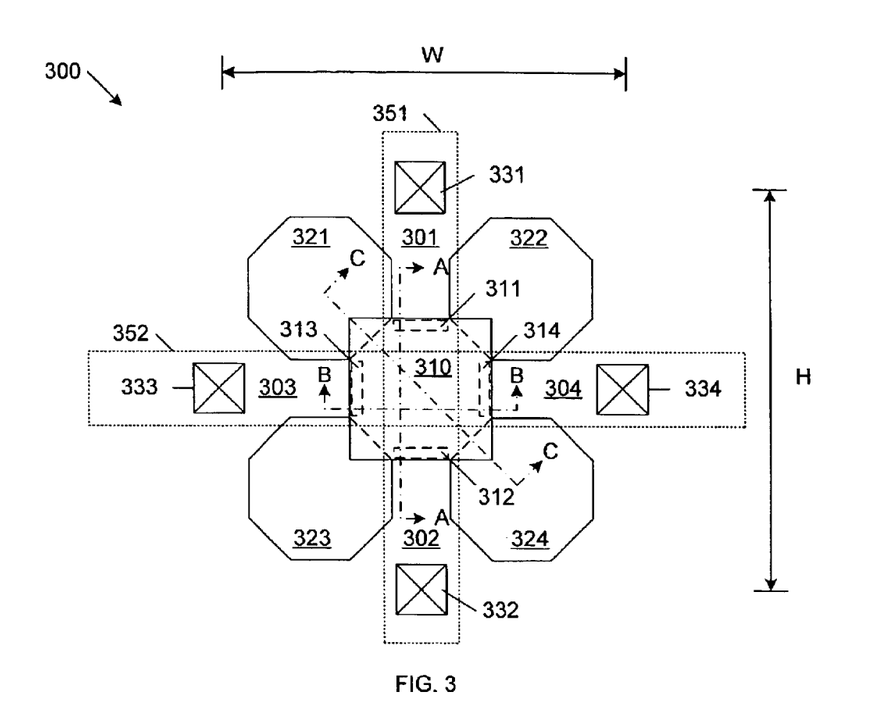
FIG. 3 is a layout diagram of a 4-bit non-volatile memory cell in accordance with one embodiment of the present invention.

FIG. 3 is a layout diagram of a portion of a 4-bit non-volatile memory (NVM) cell 300 in accordance with one embodiment of the present invention. 4-bit NVM cell 300 includes field isolation regions 321–324, gate structure 310, source/drain regions 301–304, and source/drain contacts 331–334. Gate structure 310 includes a control gate structure and a floating gate structure, which are described in more detail below. The floating gate structure includes charge-trapping regions 311–314, which are shown in dashed lines in FIG. 3. In the present embodiment, each of field isolation regions 321–324 has an octagonal shape. Other isolation regions, which are not shown in FIG. 3, isolate source/drain regions 301–304 from one another. Such isolation regions are described in more detail below in connection with the array illustrated by FIGS. 6A and 6B. 4-bit non-volatile memory cell 300 also includes a channel region, which is not explicitly labeled in FIG. 3.

Figure 4A:
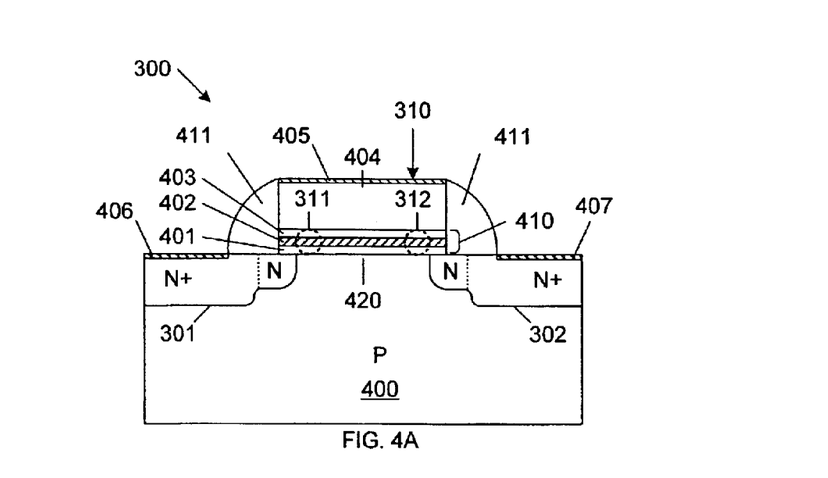
FIGS. 4A, 4B and 4C are cross sectional diagrams of the 4-bit non-volatile memory cell of FIG. 3, along section lines A—A, B—B and C—C, respectively of FIG. 3.
Figure 4B:
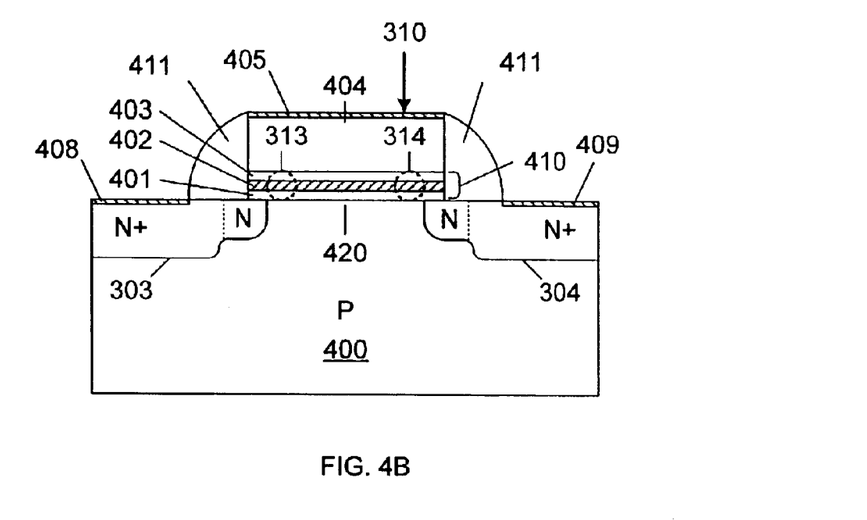
Figure 4C:
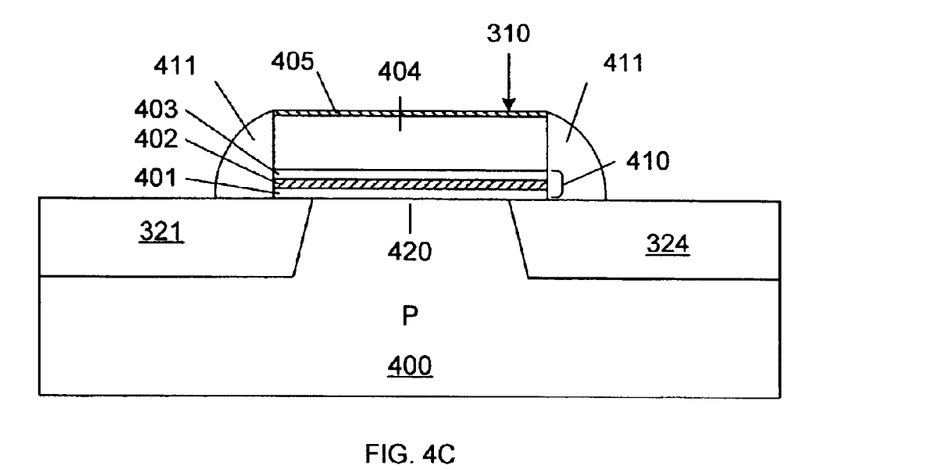

FIGS. 4A, 4B and 4C are cross sectional views of 4-bit NVM cell 300 along section lines A—A, B—B, and C—C, respectively, of FIG. 3. As illustrated in FIGS. 4A and 4B, source/drain regions 301–304 are N type semiconductor regions formed in a P type semiconductor region 400. Channel region 420 is located between source/drain regions 301–304. Gate structure 310 includes a lower dielectric layer 401, a floating gate layer 402 and an upper dielectric layer 403. In one embodiment, lower dielectric layer 401 is silicon oxide, floating gate layer 402 is silicon nitride, and upper dielectric layer 403 is silicon oxide, such that these three layers combine to form an oxide-nitride-oxide (ONO) structure 410. Silicon nitride layer 402 forms a floating gate structure, which includes charge-trapping regions 311–314. A conductive control gate is formed over ONO structure 410. In one embodiment, the control gate includes conductively doped polycrystalline silicon 404 and an overlying metal salicide region 405. Metal salicide regions 406–409 are also located over source/drain regions 301—304, respectively.

A dielectric sidewall spacer 411 laterally surrounds gate structure 310. In the described embodiment, sidewall spacer 411 can be silicon nitride, silicon oxide and/or silicon oxynitride. As illustrated in FIG. 4C, field isolation regions 321–324 are preferably shallow trench isolation (STI) regions, but can also be conventional oxide regions formed by the local oxidation of silicon (LOCOS).

In general, 4-bit NVM cell 300 includes a first transistor structure 351 that includes source/drain regions 301–302, channel region 420, and gate structure 310. This first transistor structure 351 is capable of storing 2-bits of information in charge-trapping regions 311 and 312. The 4-bit NVM cell 300 also includes a second transistor structure 352 that includes source/drain regions 303–304, channel region 420 and gate structure 310. This second transistor structure 352 is capable of storing 2-bits of information in charge-trapping regions 313 and 314. The first transistor structure 351 is orthogonal to the second transistor structure 352. The programming, reading and erasing of the 4-bit NVM cell 300 will now be described.

Erase Operation 4-bit NVM cell 300 is erased as follows, in accordance with one embodiment of the present invention. An erase control voltage of 0 to −10 Volts is applied to control gate 404, and an erase control voltage of 10 to 0 Volts is applied to source/drain contacts 331–334. Under these conditions, band-to-band tunneling of electrons will occur in each of the source/drain regions 301–304. The created holes will be accelerated in the lateral electric field and injected into the charge-trapping regions 311–314, where these holes recombine with the electrons stored in the charge-trapping regions 311–314. In the erased state, the transistor structures 351–352 exhibit relatively low threshold voltages.

Program Operation 4-bit NVM cell 300 is programmed as follows, in accordance with one embodiment of the present invention. The four charge-trapping regions 311–314 of NVM cell 300 are programmed independently. Charge-trapping region 311 is programmed in the following manner. The control gate of gate structure 310 is held at a programming voltage of 5–15 Volts. Source/drain region 301 is maintained at a voltage of 3–7 Volts, and source/drain regions 302–304 are maintained at a voltage of 0 Volts. Under these conditions, charge is stored in charge trapping region 311 by hot electron injection. Each of charge trapping regions 312–314 can be programmed in a similar manner.

Table 1 below summarizes program operations of charge trapping regions 311–314. The control gate is held at the programming voltage of 5–15 Volts in all cases in Table 1.

TABLE 1

| Charge Trapping Region Subject to Programming | Source/Drain Region 301 | Source/Drain Region 302 | Source/Drain Region 303 | Source/Drain Region 304 |
| --- | --- | --- | --- | --- |
| 311 | 3–7 Volts | 0 Volts | 0 Volts | 0 Volts |
| 312 | 0 Volts | 3–7 Volts | 0 Volts | 0 Volts |
| 313 | 0 Volts | 0 Volts | 3–7 Volts | 0 Volts |
| 314 | 0 Volts | 0 Volts | 0 Volts | 3–7 Volts |

Read Operation

Charge-trapping region 311 of NVM cell 300 is read as follows in accordance with one embodiment of the present invention. The control gate of gate structure 310 is maintained at a read voltage of 1.5 to 5 Volts. Source/drain region 302 is held at a voltage of 0.5 to 2 Volts, and source/drain region 301 is coupled to a sense amplifier (and held at a voltage of about 0 Volts), such that a reverse read condition exists for charge-trapping region 311 of transistor structure 351. Source/drain regions 303 and 304 are left floating during a read operation of charge-trapping region 311.

Charge trapping regions 312–314 are read in a similar manner. For example, charge-trapping region 312 is read by applying a read voltage of 1.5 to 5 Volts to the control gate of gate structure 310, while source/drain region 301 is held at a voltage of 0.5 to 2 Volts, and source drain region 302 is coupled to a sense amplifier (and held at a voltage of about 0 Volts), such that a reverse read condition exists for charge trapping region 312.

Table 2 below summarizes read operations of charge trapping regions 311–314.

TABLE 2

| Charge Trapping Region Subject to Reading | Source/Drain Region 301 | Source/Drain Region 302 | Source/Drain Region 303 | Source/Drain Region 304 |
| --- | --- | --- | --- | --- |
| 311 | 0 Volts | 0.5 to 2 Volts | Floating | Floating |
| 312 | 0.5 to 2 Volts | 0 Volts | Floating | Floating |
| 313 | Floating | Floating | 0 Volts | 0.5 to 2 Volts |
| 314 | Floating | Floating | 0.5 to 2 Volts | 0 Volts |

In the foregoing manner, NVM cell 300 is able to store a 4-bit information. In accordance with one embodiment, each of source/drain regions 301–304 has a width of 0.18 microns, each of source/drain contacts has a size of 0.22× 0.22 microns, and NVM cell 300 exhibits a width W of 1.23 microns and a height H of 1.23 microns. In this embodiment, NVM cell 300 has a layout area of about 1.51 micron$^2$, and a memory density of about 0.38 micron$^2$/bit.

Fabrication

Advantageously, NVM cell 300 can be fabricated largely in accordance with conventional CMOS processing steps. The fabrication of NVM cell 300 will now be described. The described process is a conventional CMOS twin-well process, except where otherwise noted.

The field isolation regions 321–324 are shallow trench isolation (STI) regions formed by conventional CMOS processing steps. More specifically, STI regions 321–324 are created by forming trenches in p-type semiconductor region 400, and filling the trenches with an insulating material, such as silicon oxide. STI regions 321–324 advantageously do not exhibit the bird's beak structure of LOCOS isolation regions. In the described example, STI regions 321–324 have a depth in the range of about 1500 to 5000 Å. In a non-preferred embodiment, field isolation regions 321–324 can be formed by a LOCOS process, however, the resultant cell size would be larger.

After field isolation regions 321–324 are formed, a sacrificial oxide (not shown) is grown, and a p-type well implant and a threshold adjusting implant are performed through the sacrificial oxide. N-type well regions (not shown) are then formed within the substrate. The sacrificial oxide is then removed.

Figure 5A:
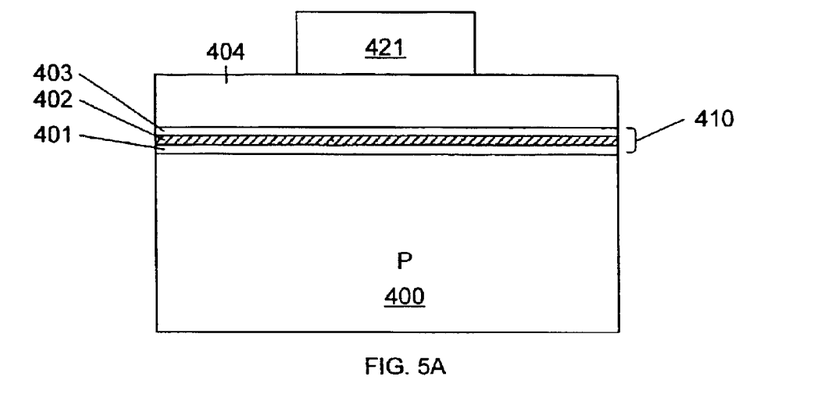
FIGS. 5A, 5B and 5C are cross sectional diagrams of the 4-bit non-volatile memory cell of FIG. 3, along section line A—A, during various stages of fabrication.

Turning now to FIG. 5A (which illustrates the fabrication of NVM cell 300 along section line A—A of FIG. 3), after STI regions 321–324 have been formed, lower dielectric layer 401 is deposited or created on the surface of p-well region 400. Floating gate layer 402 is then deposited on the upper surface of lower dielectric layer 401. Then, upper dielectric layer 403 is either deposited or created on floating gate layer 402.

In the described embodiment, lower dielectric layer 401 is a layer of silicon oxide having a thickness in the range of about 20 to 150 Angstroms. In the described embodiment, lower dielectric layer 401 is created by thermally oxidizing the upper surface of semiconductor region 400.

In the described embodiment, floating gate layer 402 is a layer of silicon nitride, deposited to a thickness of about 20 to 300 Angstroms over lower dielectric layer 401.

Upper dielectric layer 403 is a layer of silicon oxide in the described embodiment, whereby lower dielectric layer 401, floating gate layer 402 and upper dielectric layer 403 form an oxide-nitride-oxide (ONO) layer 410. The formation of ONO layer 410 is a departure from a conventional CMOS process flow. Upper dielectric layer 403 can be formed by thermal oxidation of the silicon nitride floating gate layer 402. For example, silicon nitride layer 402 can be oxidized until the upper dielectric layer 403 has a thickness in the range of about 20 to 200 Angstroms. This silicon oxide layer promotes charge retention in silicon nitride layer 402 during operation. Oxidization of silicon nitride layer 402 reduces the thickness of silicon nitride layer 402 to approximately 20 to 200 Angstroms.

In one variation, upper dielectric layer 403 can be formed by depositing a layer of silicon oxide over the silicon nitride floating gate layer 402 to a thickness of about 20 to 200 Angstroms (without intentional oxidation of the upper surface of the silicon nitride floating gate layer 402). In another variation, upper dielectric layer 403 can be formed by thermally oxidizing, nitric-oxidizing (e.g., with NO or $N_2O$), or nitrogen annealing the upper surface of silicon nitride floating gate layer 402, depositing a layer of silicon oxide over the resulting structure, and then thermally oxidizing, nitric-oxidizing (e.g., with NO or $N_2O$), or nitrogen annealing the upper surface of the resulting structure.

A layer of polysilicon 404 is then deposited over the upper surface of the ONO structure. In some embodiments, phosphorus oxychloride ($POCl_3$) is used to dope this polysilicon layer, thereby increasing the conductivity of this layer. Other embodiments may implant impurities such as phosphorus and/or arsenic ions to increase the conductivity of polysilicon layer 404. In these embodiments, polysilicon layer 404 has an n-type conductivity. In one embodiment, polysilicon layer 404 is deposited to a thickness in the range of about 500 to 5000 Angstroms.

In yet another embodiment, polysilicon layer 404 can be doped with a p-type impurity, such as boron, thereby blocking electron injection from the resulting control gate electrode during normal operation of the resulting NVM cell 300.

In accordance with another embodiment, a metal silicide layer (not shown) can be formed over the upper surface of polysilicon layer 404. A layer of metal silicide; such as tungsten silicide, can be deposited directly on polysilicon layer 404 to form the metal silicide layer. In an alternate embodiment, a blanket layer of a refractory metal, such as titanium or cobalt, is sputtered over the upper surface of polysilicon layer 404, and subsequently reacted with the underlying polysilicon layer, thereby forming the metal silicide layer.

A photoresist mask 421 is then formed over polysilicon layer 404. Photoresist mask 421 is patterned to define gate structure 310 (as well as the gate structures of other memory cells and logic transistors fabricated on the same chip).

Figure 5B:
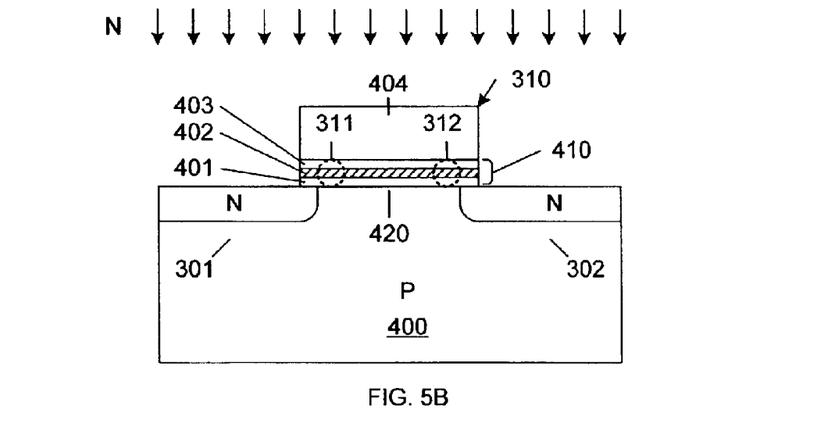

Turning now to FIG. 5B, an etch is then performed to remove the exposed portions of polysilicon layer 404 (and the overlying metal silicide layer, if present), thereby forming the control gate 310. A series of etches is then performed to remove the exposed portions of ONO layer 410, thereby forming the floating gate structure of NVM cell 300. In one embodiment, this series of etches does leaves a portion of lower dielectric layer 401, such that the underlying P type region 400 is not exposed. Photoresist mask 421 is then stripped.

A first source/drain implant mask (not shown) is then formed over the resulting structure. An N-type impurity, such as arsenic or phosphorous, is then implanted through openings of this first source/drain implant mask. In one embodiment, arsenic is implanted with a dopant density in the range of 1E14 to 1Ee16 ions/$cm^2$ and an implantation energy in the range of 10 to 100 KeV. In one variation, this implant step is performed at a high implant angle in the range of about 0 to 45 degrees. The high angle implant causes the N-type dopant to extend under the edges of gate structure 310. In another variation, both arsenic and phosphorous can be used in the first source/drain implant. The implanted N-type impurities are subsequently activated to form lightly doped portions of source/drain regions 301–304, which are aligned with gate structure 310.

In one variation, p-type implants can also be performed through the first source/drain implant mask. More specifically, a P-type impurity, such as boron (B) or Boron Fluoride ($BF_2$), can be implanted at angles from 0 to 45 degrees. In accordance with one embodiment of the present invention, the P-type impurities are implanted with a dopant density in the range of 5E12 to 1E15 ions/$cm^2$, depending on the implantation energy, which is in the range of 10 to 100 KeV. The implanted boron serves to adjust the threshold voltages of memory cell 300 and to increase the lateral field necessary for the generation of hot electrons and holes.

Figure 5C:
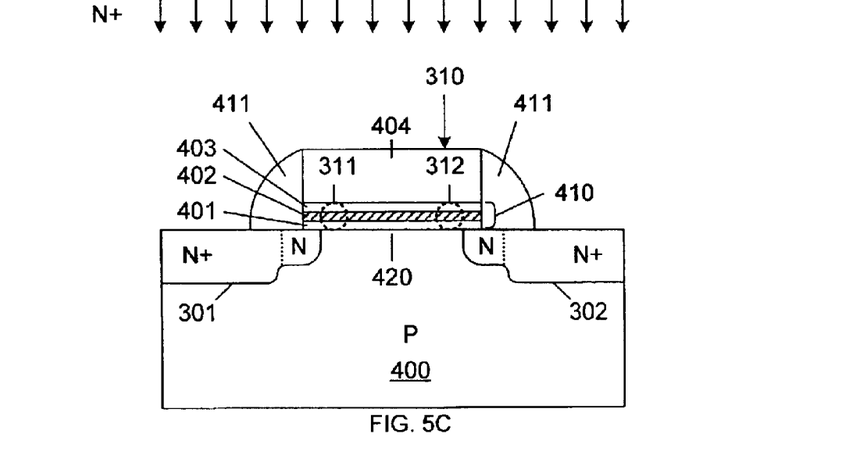

Turning now to FIG. 5C, after the first source/drain implants have been performed, sidewall spacers 411 are formed by depositing a dielectric layer over the resulting structure. The spacer dielectric material is then etched back to form dielectric spacers adjacent to the sidewalls of gate structure 310. Sidewall spacers 411 can be, for example, silicon nitride or silicon oxide.

After sidewall spacers 411 have been formed, a second source/drain implant mask (not shown) is formed over the resulting structure. An N+ implant is then performed by implanting an N-type impurity, such as arsenic or phosphorous, through the second source/drain implant mask, thereby completing source/drain regions 301–304. In one embodiment, arsenic is implanted with a dopant density in the range of 1E15 to 1E16 ions/$cm^2$ and an implantation energy in the range of 10 to 100 KeV. In one variation, both arsenic and phosphorous can be used in the N+ implant.

A blanket layer of a refractory metal, such as titanium and/or cobalt, can then be blanket deposited over the structure of FIG. 5C. An anneal is then performed, thereby causing the refractory metal layer to react with underlying silicon regions to form metal silicide regions (e.g., 405–407) on source/drain regions 301–304 and polysilicon region 404. The portions of the refractory metal layer which overlie sidewall spacers 411 remain un-reacted. This anneal also helps to activate the impurities previously implanted in p-well region 400. A refractory metal etching step removes the un-reacted portions of the refractory metal layer thereby leaving self-aligned silicide (i.e., salicide) regions 405–409, as illustrated in FIGS. 4A–4B.

After the salicide has been formed, conventional back end processes (inter-metal layer and contact formation) are performed, thereby forming contacts, such as contacts 331–334, and metal-1 and metal-2 lines, including bit lines and/or word lines, which are described in more detail below. Annealing steps performed during various stages of the process cause the N type implant regions to be activated, thereby forming source/drain regions 301–304.

Array

Figure 6A:
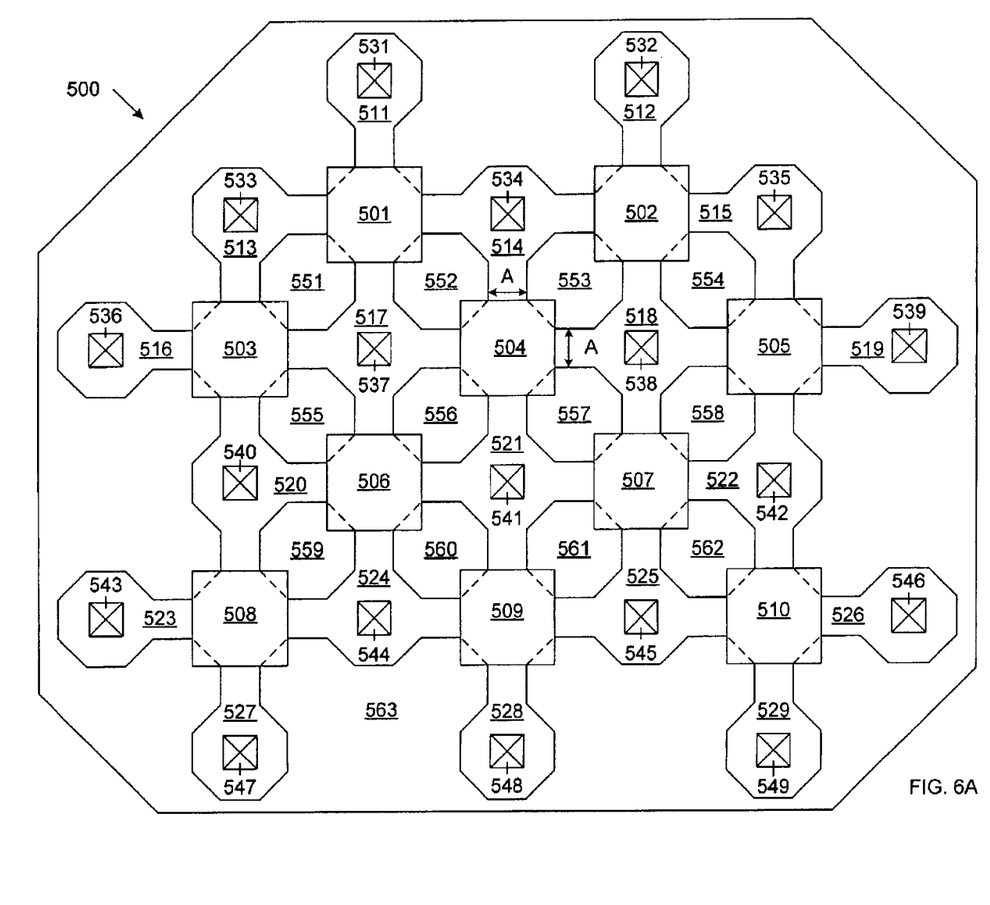
FIG. 6A is a layout diagram of an array of 4-bit non-volatile memory cells in accordance with one embodiment of the present invention.

FIG. 6A is a layout diagram of an array 500 of 4-bit non-volatile memory cells in accordance with one embodiment of the present invention. Array 500 includes gate structures 501–510 (each of which is identical to gate structure 310 of FIG. 3), source/drain regions 511–529, source/drain contacts 531–549, and field isolation regions 551–563. Although array 500 has a particular size, it is understood that arrays having other sizes can be implemented in accordance with the teachings of the present disclosure. Note that array 500 can be easily expanded by repeating the regular pattern found near the center of the array.

Toward the center of the array, each source/drain region serves four adjacent NVM cells. For example, source/drain region 521 forms a source/drain region for NVM cells defined by gate structures 504, 507, 509 and 506. This structure helps to reduce the required layout area of array 500.

Figure 6B:
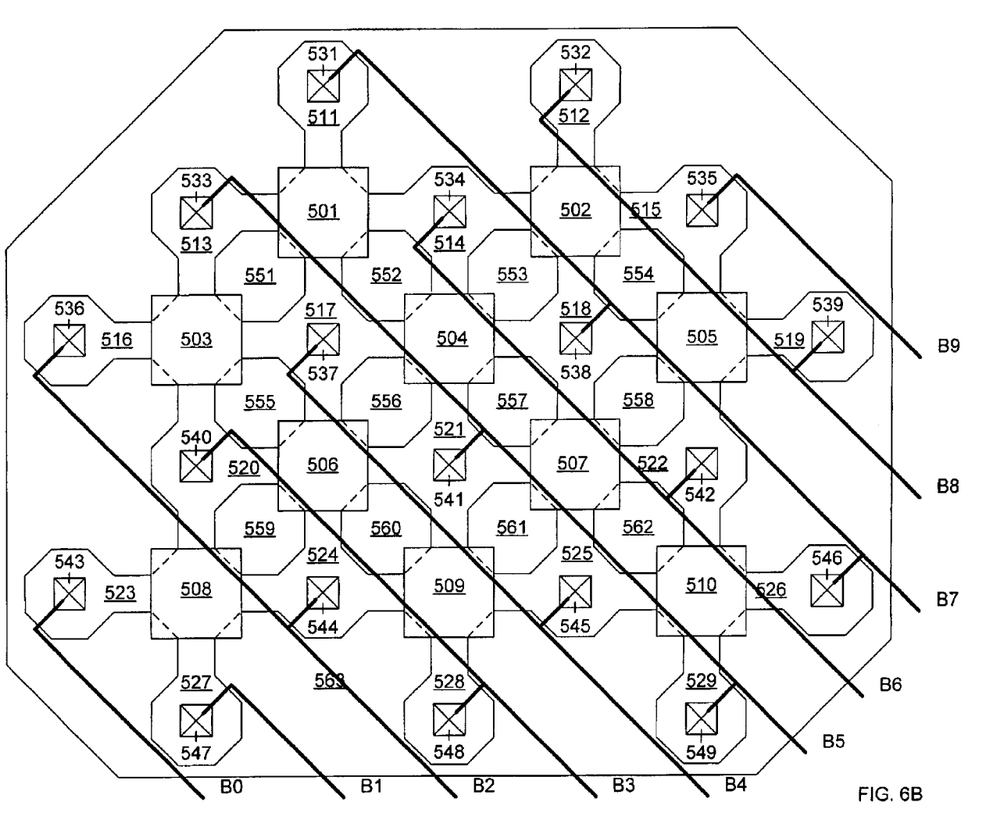
FIG. 6B is a layout diagram of the array of FIG. 6A, including bit lines.

FIG. 5B is a layout diagram of array 500, which illustrates bit lines B0–B9, in accordance with one embodiment of the present invention. Bit lines B0–B9 extend in parallel with one another, thereby enabling a regular bit line connection pattern within array 500. Each of bit lines B0–B9 is located at a 45 degree angle with respect to the horizontal axis of FIG. 5B. In general, each bit line is connected to every other source/drain contact along its path. For example, bit line B7 is connected to source/drain contacts 531, 538 and 546, and bit line B6 is connected to source/drain contacts 534 and 542. This pattern of connections is defined as an interleaved pattern of connections.

Figure 7:
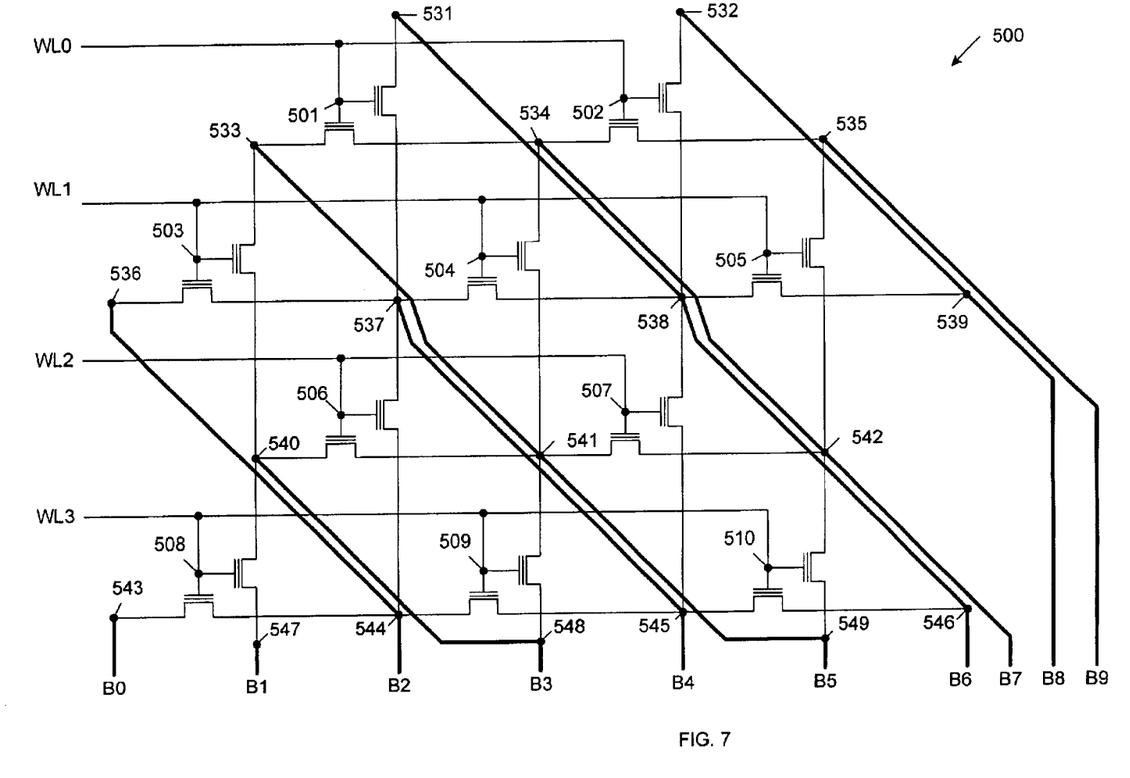
FIG. 7 is a circuit diagram of the array of 4-bit non-volatile memory cells of FIG. 6B, including word lines and bit lines, in accordance with one embodiment of the present invention.

FIG. 7 is a circuit diagram of the NVM cells of array 500. Similar elements in FIGS. 5A, 5B and 7 are labeled with similar reference numbers. Thus, the circuit diagram of FIG. 7 illustrates gate structures 501–510, source/drain contacts 531–549 and bit lines B0–B9. In FIG. 7, each 4-bit NVM cell is illustrated as a pair of NVM transistors having a common gate connection. FIG. 7 also illustrates word lines WL0–WL3, which are used to access the 4-bit NVM cells of array 500. In the example of FIG. 7, word line WL0 is coupled to gate structures 501–502, word line WL1 is coupled to gate structures 503–505, word line WL2 is coupled to gate structures 506–507, and word line WL3 is coupled to gate structures 508–510. In this embodiment, word lines WL0–WL3 are metal-1 or metal-2 lines that extend in parallel with the horizontal axis in FIG. 6B. Table 3 below defines the manner in which the 4-bit NVM cells of array 500 are accessed during program or read operations. In Table 3, each 4-bit NVM cell is identified by the corresponding gate structure. For example the 4-bit memory cell in the first row and first column of FIG. 7 is identified as 4-bit memory cell 501. Each transistor structure with an NVM cell is further identified by the orientation of the transistor structure in FIG. 7. Thus, (v) identifies a transistor structure with a vertical orientation in FIG. 7, and (h) identifies a transistor structure with a horizontal orientation in FIG. 7. Table 3 also identifies the selected bit lines and the selected word line for a program/read operation of the selected memory cell. Specific voltages for programming and reading the various charge trapping regions of the memory cells have been presented above. In the described embodiment, non-selected bit lines are left in a floating state, and non-selected word lines are held at a voltage of 0 Volts. The duration of a program operation is on the order of microseconds. Note that the duration of a program operation is not long enough and the applied source/drain voltage of 3–7 Volts is not high enough to cause the non-selected memory transistors to be erased during a program operation.

TABLE 3

| Memory Cell Subject to Program/Read | SELECTED BIT LINES | SELECTED WORD LINE |
| --- | --- | --- |
| 501(h) | B5, B7 | WL0 |
| 501(v) | B4, B6 | WL0 |
| 502(h) | B7, B9 | WL0 |
| 502(v) | B6, B8 | WL0 |
| 503(h) | B2, B4 | WL1 |
| 503(v) | B3, B5 | WL1 |
| 504(h) | B4, B6 | WL1 |
| 504(v) | B5, B7 | WL1 |
| 505(h) | B6, B8 | WL1 |
| 505(v) | B7, B9 | WL1 |
| 506(h) | B3, B5 | WL2 |
| 506(v) | B2, B4 | WL2 |
| 507(h) | B5, B7 | WL2 |
| 507(v) | B4, B6 | WL2 |
| 508(h) | B0, B2 | WL3 |
| 508(v) | B1, B3 | WL3 |
| 509(h) | B2, B4 | WL3 |
| 509(v) | B3, B5 | WL3 |
| 510(h) | B4, B6 | WL3 |
| 510(v) | B5, B7 | WL3 |

Figure 8:
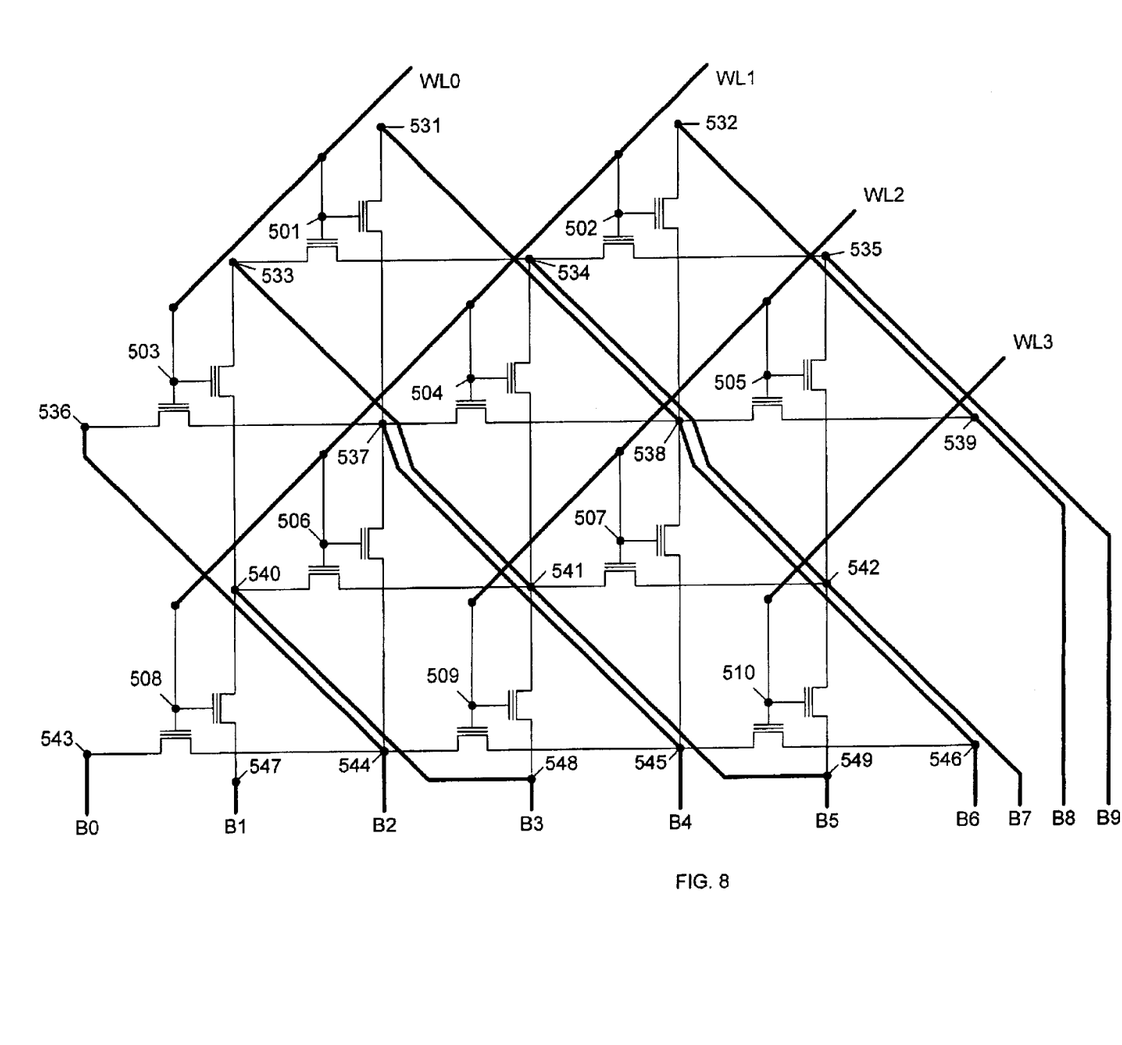
FIG. 8 is a circuit diagram of the array of 4-bit non-volatile memory cells of FIG. 6B, including word lines and bit lines, in accordance with another embodiment of the present invention.

FIG. 8 is a circuit diagram of the NVM cells of array 500, in accordance with another embodiment. Similar elements in FIGS. 6A, 6B, and 8 are labeled with similar reference numbers. Thus, the circuit diagram of FIG. 8 illustrates gate structures 501–510, source/drain contacts 531–549 and bit lines B0–B9. The circuit diagram of FIG. 8 provides a different set of word line connections to gate structures 501–510. Thus, in the circuit of FIG. 8, word line W0 is coupled to gate structures 501 and 503, word line W1 is coupled to gate structures 502, 504, 506 and 508, word line W2 is coupled to gate structures 505, 507 and 509, and word line W3 is coupled to gate structure 510. Word lines W0–W3 extend in parallel, at an angle of 45 degrees with respect to the horizontal axis in FIG. 6B.

In the circuit of FIG. 7, the word lines W0–W3 are continuous with the control gates of the gate structures that they connect. For example, word line W1 can be a continuous polysilicon structure that forms the control gates of gate structures 502, 504, 506 and 508, and also extends over the adjacent field dielectric regions 553, 556, and 559 (FIGS. 6A–6B).

Figure 9:
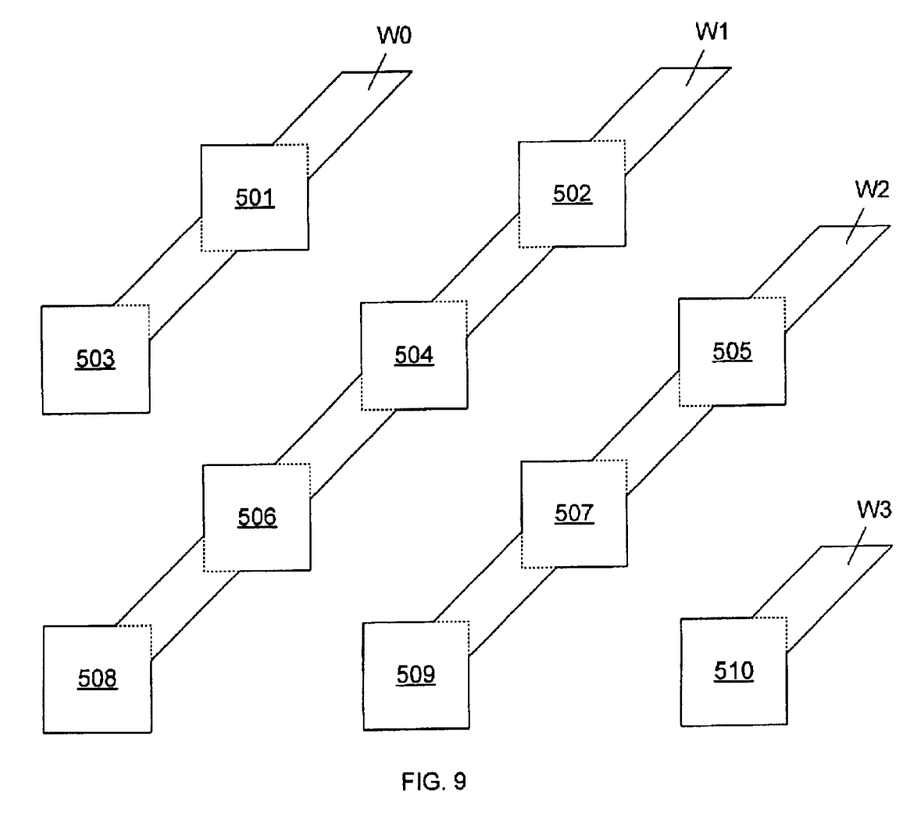
FIG. 9 is a layout diagram illustrating continuous polysilicon word lines/control gates, which are used in the circuit of FIG. 8 in accordance with one embodiment of the present invention.

FIG. 9 is a layout diagram illustrating continuous polysilicon word lines W0–W3, which also form the control gates of gate structures 501–510. The source/drain regions, source/drain contacts, and field dielectric regions are not shown in FIG. 9 for reasons of clarity. The floating gate structures of gate structures 501–510 are shown in dashed lines in FIG. 9. In other embodiments, the portions of polysilicon word lines W0–W3 that extend between the gate structures can be patterned to more closely approximate the shape of the underlying field isolation regions.

Figure 10:
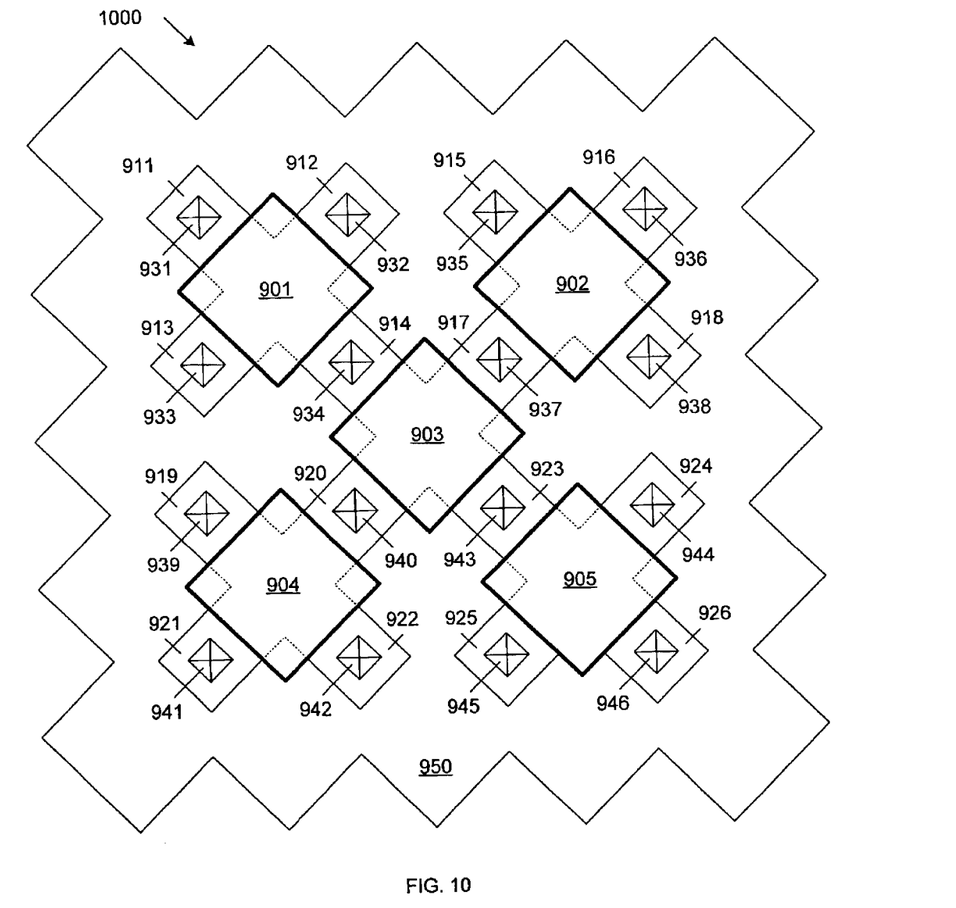
FIG. 10 is a layout diagram illustrating an array of 4-bit NVM cells in accordance with another embodiment of the present invention.

FIG. 10 is a layout diagram illustrating an array 1000 of 4-bit NVM cells in accordance with another embodiment of the present invention. Array 1000 includes gate structures 901–905, source/drain regions 911–926, source/drain contacts 931–946 and field isolation region 950. Advantageously, the structures in array 1000 have rectangular shapes. At most, each source/drain contact is common to two memory cells. For example, source/drain contact 940 is coupled to source/drain region 920, which serves NVM cells associated with gate structures 903 and 904.

Advantages

There is a limitation of effective channel length in conventional 2-bit NVM cells. This limitation is connected with the width of electron and hole distributions in the erased cell. The electron distribution spreads approximately 100 Angstroms into the channel from the source/drain junction, and the hole distribution spreads about 300 Angstroms into the channel from the source/drain junction. This limits the effective channel length necessary for 2-bit operation to about 0.2 microns. For shorter channel lengths, the two bits will influence one another. The present invention allows for a high density (microns$^2$/bit) in case of much less aggressive scaling of the channel length.

4-bit NVM cell 300 is also advantageously able to implement self-aligned salicide on both the control gate 404 and the source/drain regions 301–304. The use of self-aligned salicide and metal (not diffusion) bit lines results in low RC delay and high-speed operation.

Moreover, because field isolation regions are used to isolate the source/drain regions, there is minimal leakage between adjacent source/drain regions in array 500.

These advantages enable the memory transistor of the present invention to be aggressively scaled (shrunk), thereby providing for a more adaptable and embeddable memory transistor in advanced CMOS technology.

Although the invention has been described in connection with several embodiments, it is understood that this invention is not limited to the embodiments disclosed, but is capable of various modifications which would be apparent to a person skilled in the art. For example, non-volatile memory cells capable of storing other even numbers of bits greater than four can be implemented. Thus, the invention is limited only by the following claims.

We claim:

1. A non-volatile memory cell comprising:
   a semiconductor region having a first conductivity type;
   a plurality of field isolation regions located in the semiconductor region;
   four or more source/drain regions located in the semiconductor region adjacent to the field isolation regions, the source/drain regions having a second conductivity type, opposite the first conductivity type, wherein the field isolation regions and the source/drain regions laterally surround a channel region in the semiconductor region;
   a gate structure including a floating gate structure and a control gate structure extending over the channel region, portions of the field isolation regions and portions of the source/drain regions, wherein the floating gate structure includes a plurality of charge trapping regions, wherein each of the charge trapping regions is located adjacent to a corresponding one of the source/drain regions.

2. The non-volatile memory cell of claim 1, wherein each of the field isolation regions has an octagonal shape.

3. The non-volatile memory cell of claim 1, wherein each of the field isolation regions has a square shape.

4. The non-volatile memory cell of claim 1, wherein each of the source/drain regions has a rectangular shape.

5. The non-volatile memory cell of claim 1, wherein the floating gate structure comprises an oxide-nitride-oxide (ONO) structure.

6. The non-volatile memory cell of claim 1, wherein the charge trapping regions are located in a silicon nitride layer in the floating gate structure.

7. The non-volatile memory cell of claim 1, wherein the field isolation regions comprise shallow trench isolation regions.

8. The non-volatile memory cell of claim 1, wherein there are four source/drain regions configured in an orthogonal pattern.

9. The non-volatile memory cell of claim 1, further comprising a plurality of bit lines coupled to the source/drain regions, wherein each of the source/drain regions is coupled to a separate bit line.

10. The non-volatile memory cell of claim 1, further comprising:
    dielectric sidewall spacers located adjacent to the gate structure; and
    salicide regions located on the control gate structure and the source/drain regions.

11. The non-volatile memory cell of claim 1, wherein the charge trapping regions are electrically isolated from one another.

12. An array of 4-bit non-volatile memory cells comprising:
    a semiconductor substrate;
    a plurality of field isolation regions located in the semiconductor substrate;
    a plurality of gate structures located over the semiconductor substrate, wherein each of the gate structures includes four charge trapping regions; and
    a plurality of cross-shaped source/drain regions defined by the field isolation regions and the gate structures, wherein each of the cross-shaped source/drain regions serves as a source/drain for four different 4-bit non-volatile memory cells.

13. The array of claim 12, wherein each gate structure has a square shape.

14. The array of claim 12, further comprising dielectric sidewall spacers located adjacent to the gate structures.

15. The array of claim 14, further comprising salicide located over the gate structures and the cross-shaped source/drain regions.

16. The array of claim 12, further comprising a plurality of word lines contacting the gate structures.

17. The array of claim 16, wherein the word lines comprise polysilicon structures continuous with the gate structures and extending over the field isolation regions.

18. The array of claim 16, wherein the word lines comprise metal lines.

19. The array of claim 12, further comprising a plurality of bit lines, wherein each of the 4-bit non-volatile memory cells is coupled to four different bit lines.

20. The array of claim 19, wherein the bit lines are connected to the 4-bit non-volatile memory cells in an interleaved pattern.

21. The array of claim 12, wherein the field isolation regions comprise shallow trench isolation (STI) regions.

22. The array of claim 12, wherein each of the gate structures comprises an oxide-nitride-oxide (ONO) structure.

23. The array of claim 12, wherein the nitride of the ONO structures form floating gates of the 4-bit non-volatile memory transistors.

24. A method of fabricating an array of multi-bit non-volatile memory cells, the method comprising:
    forming a plurality of field isolation regions in a semiconductor substrate;

forming a lower dielectric layer over the semiconductor substrate;

forming a floating gate dielectric layer over the lower dielectric layer;

forming an upper dielectric layer over the floating gate dielectric layer;

forming a control gate layer over the upper dielectric layer;

patterning the control gate layer, the upper dielectric layer and the floating gate dielectric layer to form a plurality of gate structures, each of the gate structures having a control gate structure formed from the control gate layer and a floating gate structure formed from the lower dielectric layer, the floating gate dielectric layer and the upper dielectric layer; and forming a plurality source/drain regions in the substrate, wherein four or more source/drain regions are aligned with each of the gate structures and the field isolation regions.

25. The method of claim 24, wherein the step of forming the source/drain regions comprises:

performing a first source/drain implant into the substrate in alignment with the gate structures and field isolation regions;

forming sidewall spacers adjacent to the gate structures; and then performing a second source/drain implant into the substrate in alignment with the sidewall spacers and the field isolation regions.

26. The method of claim 25, wherein the first source/drain implant is performed at a tilt angle greater than 0 degrees.

27. The method of claim 25, further comprising forming self-aligned salicide regions over the control gate structures and the portions of the source/drain regions that are not covered by the sidewall spacers.

28. A method of operating a non-volatile memory cell, the method comprising:

storing a first bit of information in a first charge trapping region of a floating gate structure;

storing a second bit of information in a second charge trapping region of the floating gate structure;

storing a third bit of information in a third charge trapping region of the floating gate structure; and storing a fourth bit of information in a fourth charge trapping region of the floating gate structure.

29. The method of claim 28, further comprising:

reading the first bit of information from the first charge trapping region of the floating gate structure;

reading the second bit of information from the second charge trapping region of the floating gate structure;

reading the third bit of information from the third charge trapping region of the floating gate structure; and reading the fourth bit of information from the fourth charge trapping region of the floating gate structure.

30. The method of claim 29, wherein each of the charge trapping regions are programmed with a current flow in a first direction, and read with a current flow in a second direction, opposite the first direction.

* * * * *